United States Patent
Wiesen et al.

(10) Patent No.: US 7,324,309 B1
(45) Date of Patent: Jan. 29, 2008

(54) CROSS-TRACK SHIELDING IN A GMR HEAD

(75) Inventors: Kurt Wiesen, Longmont, CO (US); William R. Cross, Lyons, CO (US)

(73) Assignee: Maxtor Corporation, Longmont, CO (US)

( * ) Notice: Subject to any disclaimer, the term of this patent is extended or adjusted under 35 U.S.C. 154(b) by 380 days.

(21) Appl. No.: 10/670,544

(22) Filed: Sep. 24, 2003

Related U.S. Application Data

(60) Provisional application No. 60/452,617, filed on Mar. 6, 2003.

(51) Int. Cl.
*G11B 5/39* (2006.01)
*G11B 5/10* (2006.01)

(52) U.S. Cl. ................................. 360/319; 360/324.12

(58) Field of Classification Search ................ 360/319, 360/324.12
See application file for complete search history.

(56) References Cited

U.S. PATENT DOCUMENTS

| | | | |
|---|---|---|---|
| 4,935,832 A | 6/1990 | Das et al. | 360/112 |
| 5,490,028 A | 2/1996 | Ang et al. | 360/126 |
| 5,668,686 A | 9/1997 | Shouji et al. | 360/319 |
| 6,125,009 A | 9/2000 | Ishiwata et al. | 360/317 |
| 6,292,334 B1 | 9/2001 | Koike et al. | 360/319 |
| 6,342,993 B1 | 1/2002 | Sato et al. | 360/319 |
| 6,381,107 B1 | 4/2002 | Redon et al. | 360/324.2 |
| 6,396,670 B1 | 5/2002 | Murdock | 360/319 |
| 6,430,010 B1 | 8/2002 | Murdock | 360/319 |
| 6,456,467 B1 | 9/2002 | Mao et al. | 360/319 |
| 6,466,419 B1 | 10/2002 | Mao | 360/324.12 |
| 6,496,334 B1 | 12/2002 | Pang et al. | 360/319 |
| 6,680,832 B2 * | 1/2004 | Fontana et al. | 360/324.2 |
| 6,754,056 B2 * | 6/2004 | Ho et al. | 360/324.2 |
| 6,801,413 B2 * | 10/2004 | Seyama et al. | 360/324.12 |
| 6,870,718 B2 * | 3/2005 | Takahashi et al. | 360/327.3 |
| 7,016,167 B2 * | 3/2006 | Fontana et al. | 360/324.12 |
| 7,123,454 B2 * | 10/2006 | Takano | 360/324.12 |
| 2003/0174446 A1 * | 9/2003 | Hasegawa | 360/319 |
| 2003/0214763 A1 * | 11/2003 | Childress et al. | 360/324.2 |

OTHER PUBLICATIONS

S.W. Yuan, "Off-Track Spacing Loss of Shielded MR Heads", IEEE Transactions on Magnetics, vol. 30, No. 3, May 1994, p. 1267.
S. Mao, et al., "Spin-Valve Heads With Self-Stabilized Free Layer by Antiferromagnet", IEEE Transactions on Magnetics, vol. 38, No. 1, Jan. 2002, p. 26.

* cited by examiner

*Primary Examiner*—Julie Anne Watko
(74) *Attorney, Agent, or Firm*—Foley & Lardner LLP

(57) ABSTRACT

A magnetoresistive read/write head includes an integral top and side shields deposited on top of and substantially surrounding the multiple layers of the MR sensor stack. Such a design is particularly advantageous in CPP designs in which the only spacing necessary between the side shields and the bottom shield is due to a gap layer. The integral top and side shields design works both with CPP heads having pile bias stabilization as well as those having permanent magnet abutted junctions or patterned exchange bias stabilization. In addition, the design is also advantageous in CIP heads having permanent magnet abutted junctions or patterned exchange bias stabilization. In this latter embodiment, it may be possible to reduce the profile of the permanent magnet and any conductors to increase the efficacy of the side shields.

33 Claims, 7 Drawing Sheets

CROSS-TRACK SHIELDING IN A GMR HEAD

CROSS-REFERENCE TO RELATED APPLICATIONS

This application claims priority from U.S. Provisional Patent Application No. 60/452,617, filed Mar. 6, 2003, entitled "Cross-Track Shielding to Reduce Magnetic to Physical Reader Width Offset", the contents of which are incorporated herein by reference.

FIELD OF THE INVENTION

This application relates to a magnetoresistive (MR) read element arrangement for data storage applications, particularly a giant magnetoresistive (GMR) read element with cross-track shielding.

BACKGROUND OF THE INVENTION

In hard disk drives, data is written to and read from magnetic recording media, herein called disks, utilizing magnetoresistive (MR) transducers commonly referred to as MR heads. Typically, one or more disks having a thin film of magnetic material coated thereon are rotatably mounted on a spindle. An MR head mounted on an actuator arm is positioned in close proximity to the disk surface to write data to and read data from the disk surface.

During operation of the disk drive, the actuator arm moves the MR head to the desired radial position on the surface of the rotating disk where the MR head electromagnetically writes data to the disk and senses magnetic field signal changes to read data from the disk. Usually, the MR head is integrally mounted in a carrier or support referred to as a slider. The slider generally serves to mechanically support the MR head and any electrical connections between the MR head and the disk drive. The slider is aerodynamically shaped, which allows it to fly over and maintain a uniform distance from the surface of the rotating disk.

Typically, an MR head includes an MR read element to read recorded data from the disk and an inductive write element to write the data to the disk. The read element includes a thin layer of magnetoresistive sensor stripe sandwiched between two magnetic shields that are electrically connected together but are otherwise isolated. The shields are constructed so that one is just upstream of the sensor stripe and one is just downstream of the sensor stripe. A constant current is passed through the sensor stripe, and the resistance of the magnetoresistive stripe varies in response to a previously recorded magnetic pattern on the disk. In this way, a corresponding varying voltage is detected across the sensor stripe. The magnetic shields help the sensor stripe to focus on a narrow region of the magnetic medium, hence improving the spatial resolution of the read head.

Earlier MR sensors operated on the basis of the anisotropic magnetoresistive (AMR) effect in which a component of the read element resistance varied as the square of the cosine of the angle between the magnetization and the direction of sense current flowing through the read element. In this manner, because the magnetic field of the recording media would effect the magnetization direction within the read element, the change in resistance could be monitored to determine the type of external magnetic field applied by the magnetic recording medium. Most current disk drive products utilize a different, more pronounced magnetoresistive effect known as the GMR or spin valve effect. This effect utilizes a layered magnetic sensor that also has a change in resistance based on the application of an external magnetic field. While multiple layers are typically used, the most relevant layers are a pair of ferromagnetic layers separated by an electrically conductive non-magnetic spacer layer such as copper. One of the ferromagnetic layers known as the "free" layer is a soft magnetic material whose magnetization is changed by the external magnetic field caused by the close proximity of the magnetic recording medium. The other ferromagnetic layer, known as the "pinned" layer, is also a soft magnetic material that has its magnetization direction fixed by an adjacent layer known as the "pinning" layer. A layer of antiferromagnetic material is typically used as the pinning layer. A sense current is passed from one end of the ferromagnetic and conductive layers to the opposite end of those same layers. The resistance of this tri-layer structure is proportional to the cosine of the magnetization angle between the two ferromagnetic layers. Since one of the layers has a magnetization angle that is pinned and the other ferromagnetic layer has a magnetization that can vary in response to the magnetic field from an adjacent magnetic recording medium, the resistance of the tri-layer structure is a function of that magnetic field from the recording medium. It has been discovered that this tri-layer structure behaves in this manner because of a spin dependent scattering of electrons, the scattering being dependent on the spin of the electron and the magnetization direction of the layer through which the electron passes.

Typically, MR sensors have not included shields at either end of the sensor stripe in what is known as the cross track direction. Various recent advances in commercial MR sensors, however, have increased the need for cross-track shielding. Competitive pressures within the computer industry require progressively increasing storage capacity within a given footprint for a disk drive. To provide this increased storage capacity, it is necessary to increase the areal density of data stored on the magnetic media. The data is stored in bits on linear tracks. The number of bits per inch in each track and the number of side-by-side tracks per inch are two parameters that determine the areal density. Another parameter is the bit aspect ratio (BAR), which is the ratio of the width (cross-track dimension) of an individual bit to the length (down-track dimension) of an individual bit. While commercial disk drive systems have typically had a BAR of approximately 20, the need for increased areal density has driven the BAR of more current disk drives down to approximately 7. Because of this shrinking of the BAR, the effect of adjacent tracks on the read process is becoming more pronounced.

It also aids in understanding to appreciate that the widths of the top and bottom shields are very great compared to the width of the MR sensor stripe. While the sensor stripe is approximately of the same width as a track, the shields are orders of magnitude wider. This is shown in FIG. 2 in which a first track 100 of bits 106 is adjacent to a second track 102 of bits 106, which in turn is adjacent to a third track 104 of bits 106. A read head 108 having an MR sensor stripe 110 is centered over the second track 102. It can be seen that the sensor stripe 110 is of approximately the same width as the bits 106 of each track.

In addition, the gap between the top and bottom shields, since it is selected to be proportional to the length of the bit, has increased relative to the width of the MR sensor stripe. Further, in actuality the top shield does not have a bottom surface that is parallel to the top surface of the bottom shield. This is because the top shield is deposited on top of the sensor stripe and on top of the permanent magnets and conductors/leads on either side of the sensor stripe. Since the permanent magnets and conductors/leads on either side of the sensor stripe are taller than the sensor stripe itself, the portion of the top shield above the sensor stripe is closer to the bottom shield than are the portions of the top shield above the permanent magnets and conductors/leads on either side thereof. It may be that the off-track gap is as much as twice the on-track gap. For this reason, the gap spacing is larger in regions offset in the cross-direction than it is directly over the track intended to be read.

U.S. Pat. No. 6,466,419 (Mao) discloses an MR sensor with side shields. A "current perpendicular to plane" (CPP) spin valve head is disclosed in which side shields exist to partially enclose the sensor stripe in the cross-track direction. Unfortunately, there is little to no discussion in Mao of how to manufacture such a structure. Further, there is no discussion of how to implement side shields in structures that are biased in any manner other than pile biasing of a CPP sensor.

It is against this background and a desire to improve on the prior art that the present invention has been developed.

SUMMARY OF THE INVENTION

In view of the foregoing, a broad objective of the present invention is to provide a read element with minimized adjacent track reading. It is also an objective of the present invention to provide a read element with side shields. It is still further an objective of the present invention to provide a commercially-viable method for producing a read element with side shields.

In carrying out these and other objectives, features, and advantages of the present invention, a method of producing a read head is provided. The method includes depositing multiple GMR sensor layers into a stack on a bottom shield, the stack having a top side, applying photoresist material to a first region of the top side of the stack, and removing portions of the stack that are not covered by the photoresist material to expose portions of the bottom shield and sides of the remaining portions of the stack. The method also includes depositing insulator material on to the exposed portions of the bottom shield and against at least portions of sides of the remaining portions of the stack, removing the photoresist material, and depositing a top shield that covers the top and substantially surrounds the sides of the remaining portions of the stack.

The depositing of the insulator material may be a self-aligned process. The top and bottom layers of the stack may be electrodes. The top, side, and bottom shields may be electrically conducting. A sense current may be carried toward and away from the stack by the shields.

The multiple GMR sensor layers in the stack may also include a pinned layer and a free layer. The multiple GMR sensor layers in the stack may also include a stabilization layer. The stabilization layer may include patterned areas of exchange material. The free layer may be biased via pile biasing. The free layer may be biased via patterned exchange biasing. The free layer may be biased via permanent magnet abutted junctions.

The read head may be a CIP read head. The read head may be a CPP read head. The operation of depositing insulator material may include depositing electrically conductive leads along with the insulator material so that the electrically conductive leads are in contact with a portion of the stack. The operation of depositing insulator material may include depositing permanent magnet material along with the insulator material so that the permanent magnets are abutted against a portion of the stack.

Another aspect of the present invention relates to a read head, including a GMR spin valve stack including at least a pinned layer, a free layer, and a stabilization layer including patterned exchange bias material. The read head also includes a pair of shields, one disposed on either side of the GMR spin valve stack, with one of the shields being formed to include integral side shields that substantially enclose the GMR spin valve stack between the pair of shields.

The GMR spin valve stack may be configured to operate in a current perpendicular to plane (CPP) mode. The pair of shields may be electrically conductive and the GMR spin valve stack may include an electrode at the top thereof and an electrode at the bottom thereof. The GMR spin valve stack may be configured to operate in a current in plane (CIP) mode. The read head may further include electrically conductive leads that are in a gap formed between the pair of shields. The read head may further include a layer of insulating material forming a gap between the pair of shields in the regions at either end of the GMR spin valve stack. The gap layer may be deposited in a self-aligned process. The gap layer may include a portion that covers at least portions of the sides of the stack.

Another aspect of the present invention relates to a read head, including a GMR spin valve stack including at least a pinned layer and a free layer, a pair of shields, one disposed on either side of the GMR spin valve stack, with one of the shields being formed to include integral side shields that substantially enclose the GMR spin valve stack between the pair of shields, and an insulated layer of permanent magnet material disposed between the shields and abutting opposite ends of the GMR spin valve stack.

The read head may further include a layer of insulating material on either side of the permanent magnet material to form a gap between the pair of shields in the regions at either end of the GMR spin valve stack. The GMR spin valve stack may include a free layer having opposed ends and the layer of permanent magnet material abuts at least a portion of the ends of the free layer.

Numerous additional features and advantages of the present invention will become apparent to those skilled in the art upon consideration of the further description that follows.

DETAILED DESCRIPTION OF THE PREFERRED EMBODIMENT

Reference will now be made to the accompanying drawings, which assist in illustrating the various pertinent features of the present invention. Although the present invention will now be described primarily in conjunction with disk drives, it should be expressly understood that the present invention might be applicable to other applications where side shielding of a magnetoresistive sensor is required/desired. In this regard, the following description of a GMR read element in a disk drive is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain best modes known of practicing the invention and to enable others skilled in the art to utilize the invention in such, or other embodiments and with various modifications required by the particular application(s) or use(s) of the present invention.

Figure 1:
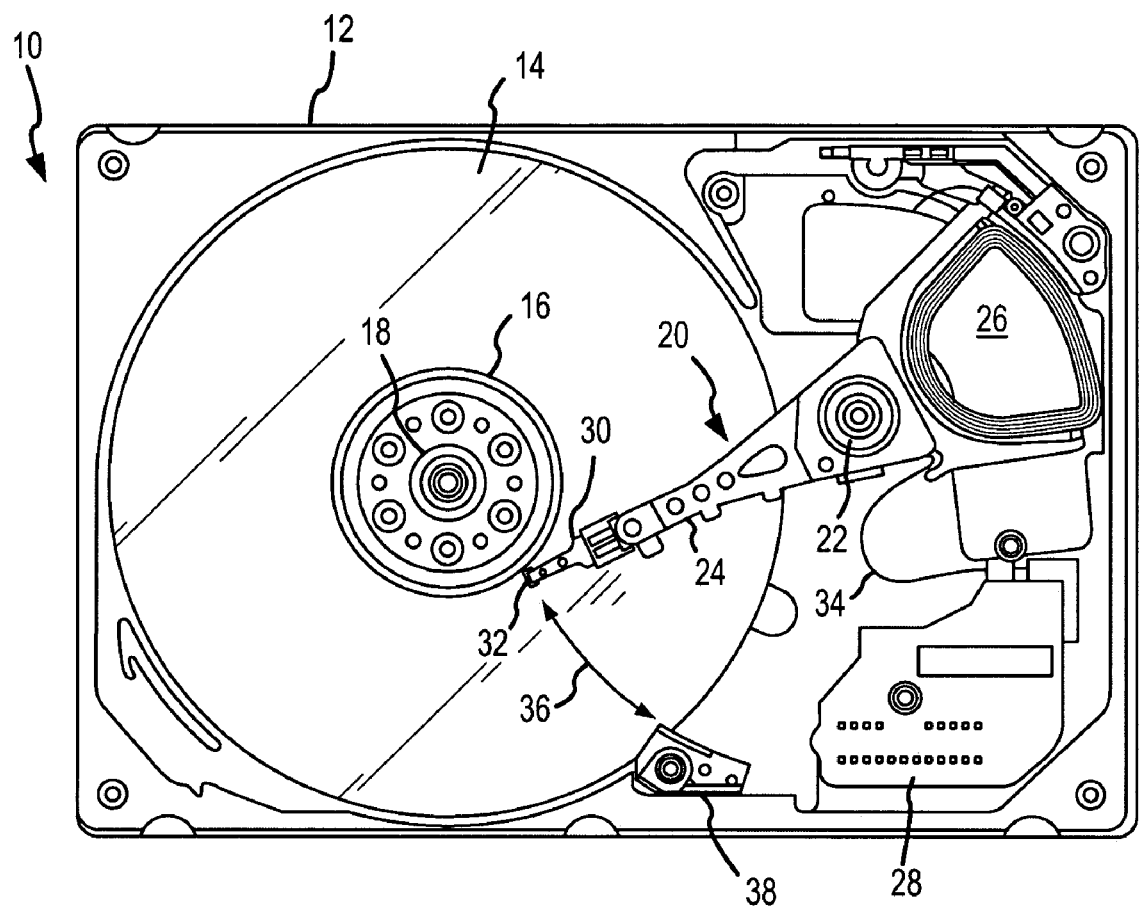
FIG. 1 is a top view of a disk drive that utilizes a head of the present invention.
Figure 2:
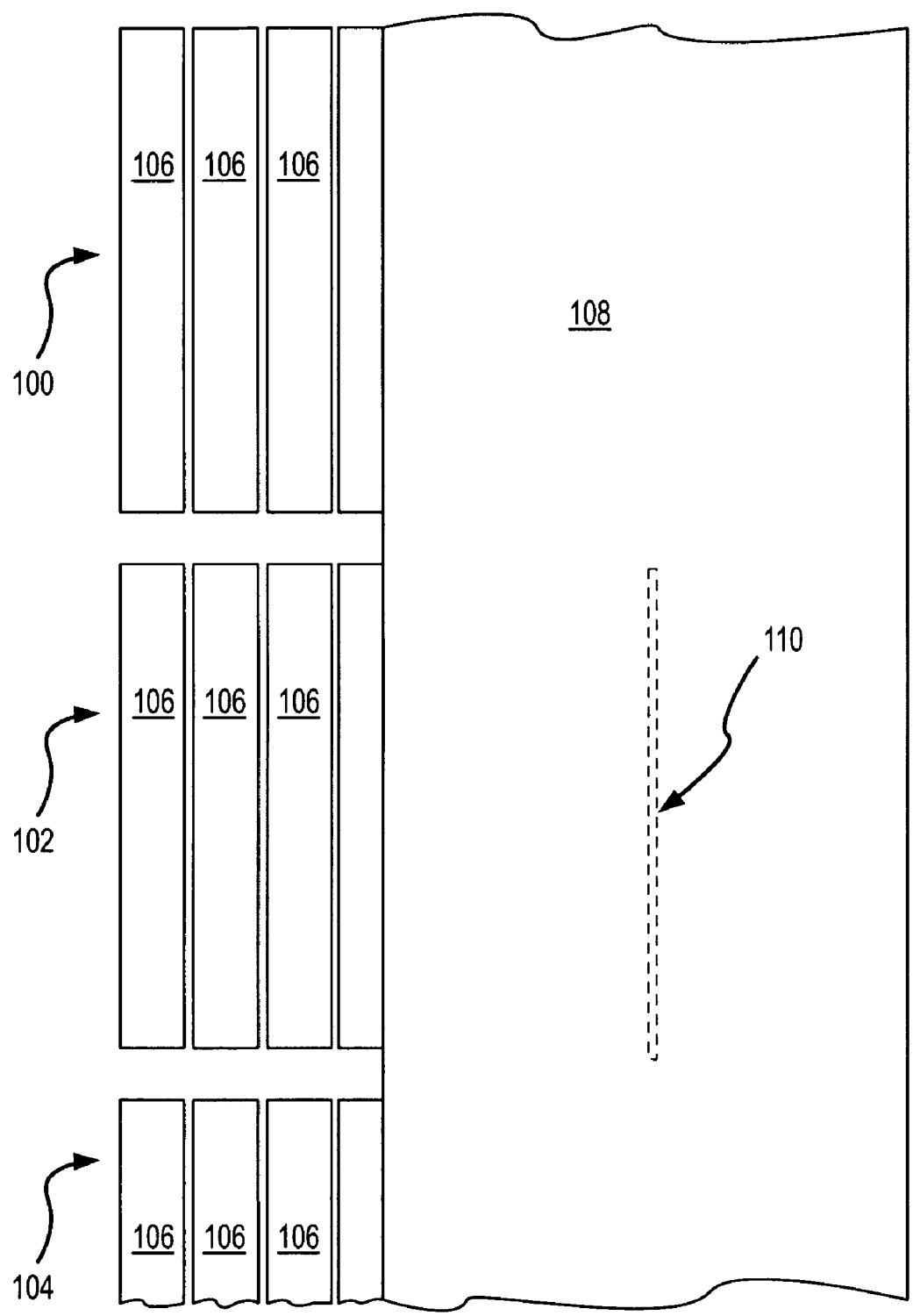
FIG. 2 is a top view of a read head centered over a track of data storage bits that is moving relative to the head.

FIG. 1 illustrates one embodiment of a disk drive 10. The disk drive 10 generally includes a base plate 12 and a cover (not shown) that may be disposed on the base plate 12 to define an enclosed housing or space for the various disk drive components. The disk drive 10 includes one or more data storage disks 14 of any appropriate computer-readable data storage media. Typically, both of the major surfaces of each data storage disk 14 include a plurality of concentrically disposed tracks for data storage purposes. Each disk 14 is mounted on a hub or spindle 16, which in turn is rotatably interconnected with the disk drive base plate 12 and/or cover. Multiple data storage disks 14 are typically mounted in vertically spaced and parallel relation on the spindle 16. Rotation of the disk(s) 14 is provided by a spindle motor 18 that is coupled to the spindle 16 to simultaneously spin the data storage disk(s) 14 at an appropriate rate.

The disk drive 10 also includes an actuator arm assembly 20 that pivots about a pivot bearing 22, which in turn is rotatably supported by the base plate 12 and/or cover. The actuator arm assembly 20 includes one or more individual rigid actuator arms 24 that extend out from near the pivot bearing 22. Multiple actuator arms 24 are typically disposed in vertically spaced relation, with one actuator arm 24 being provided for each major data storage surface of each data storage disk 14 of the disk drive 10. Other types of actuator arm assembly configurations could be utilized as well, such as an "E" block having one or more rigid actuator arm tips or the like that cantilever from a common structure. In any case, movement of the actuator arm assembly 20 is provided by an actuator arm drive assembly, such as a voice coil motor 26 or the like. The voice coil motor 26 is a magnetic assembly that controls the operation of the actuator arm assembly 20 under the direction of control electronics 28. Any appropriate actuator arm assembly drive type may be utilized by the disk drive 10, including a linear drive (for the case where the actuator arm assembly 20 is interconnected with the base plate 12 and/or cover for linear movement versus the illustrated pivoting movement about the pivot bearing 22) and other types of rotational drives.

A load beam or suspension 30 is attached to the free end of each actuator arm 24 and cantilevers therefrom. Typically, the suspension 30 is biased generally toward its corresponding disk 14 by a spring-like force. A slider 32 is disposed at or near the free end of each suspension 30. What is commonly referred to as the "head" (e.g., transducer) is appropriately mounted on the slider 32 and is used in disk drive read/write operations.

The head on the slider 32 may utilize various types of read/write technologies such as anisotropic magnetoresistive (AMR), giant magnetoresistive (GMR), and tunneling magnetoresistive (TuMR), other magnetoresistive technologies, or other suitable technologies. AMR is due to the anisotropic magnetoresistive effect with a normalized change in resistance ($\Delta R/R$) of 2-4%. GMR results from spin-dependent scattering mechanisms between two magnetic layers (or more). The typical use in recording heads is the spin valve device that uses a free layer to detect external fields, and a pinned magnetic layer. The normalized change in resistance is typically 8-12%, but can be as large as 15-20% when used with specular capping layers and spin-filter layers. TuMR is similar to GMR, but is due to spin dependent tunneling currents across an isolation layer. The typical embodiment includes a free layer and a pinned layer separated by an insulating layer of $Al_2O_3$ with the current flowing perpendicular to the film plane, producing normalized change in resistance of 12-25%. The term magnetoresistive is used in this application to refer to all these types of magnetoresistive sensors and any others in which a variation in resistance of the sensor due to the application of an external magnetic field is detected. The biasing forces exerted by the suspension 30 on its corresponding slider 32 thereby attempt to move the slider 32 in the direction of its corresponding disk 14. Typically, this biasing force is such that if the slider 32 were positioned over its corresponding disk 14, without the disk 14 being rotated at a sufficient velocity, the slider 32 would be in contact with the disk 14.

The head on the slider 32 is interconnected with the control electronics 28 of the disk drive 10 by a flex cable 34 that is typically mounted on the actuator arm assembly 20. Signals are exchanged between the head and its corresponding data storage disk 14 for disk drive read/write operations. In this regard, the voice coil motor 26 is utilized to pivot the actuator arm assembly 20 to simultaneously move the slider 32 along a path 36 and "across" the corresponding data storage disk 14 to position the head at the desired/required radial position on the disk 14 (i.e., at the approximate location of the correct track on the data storage disk 14) for disk drive read/write operations.

When the disk drive 10 is not in operation, the actuator arm assembly 20 is pivoted to a "parked position" to dispose each slider 32 generally at or beyond a perimeter of its corresponding data storage disk 14, but in any case in vertically spaced relation to its corresponding disk 14. This is commonly referred to in the art as being a dynamic load/unload disk drive configuration. In this regard, the disk drive 10 includes a ramp assembly 38 that is disposed beyond a perimeter of the data storage disk 14 to typically both move the corresponding slider 32 vertically away from its corresponding data storage disk 14 and to also exert somewhat of a retaining force on the actuator arm assembly 20. Any configuration for the ramp assembly 38 that provides the desired "parking" function may be utilized. The disk drive 10 could also be configured to be of the contact start/stop type, where the actuator arm assembly 20 would pivot in a direction to dispose the slider(s) 32 typically toward an inner, non-data storage region of the corresponding data storage disk 14. Terminating the rotation of the data storage disk(s) 14 in this type of disk drive configuration would then result in the slider(s) 32 actually establishing contact with or "landing" on their corresponding data storage disk 14, and the slider 32 would remain on the disk 14 until disk drive operations are re-initiated.

The slider 32 of the disk drive 10 may be configured to "fly" on an air bearing during rotation of its corresponding data storage disk(s) 14 at a sufficient velocity. The slider 32 may be disposed at a pitch angle such that its leading edge is disposed further from its corresponding data storage disk 14 than its trailing edge. The head would typically be incorporated on the slider 32 generally toward its trailing edge since this is positioned closest to its corresponding disk 14. Other pitch angles/orientations could also be utilized for flying the slider 32.

Figure 3:
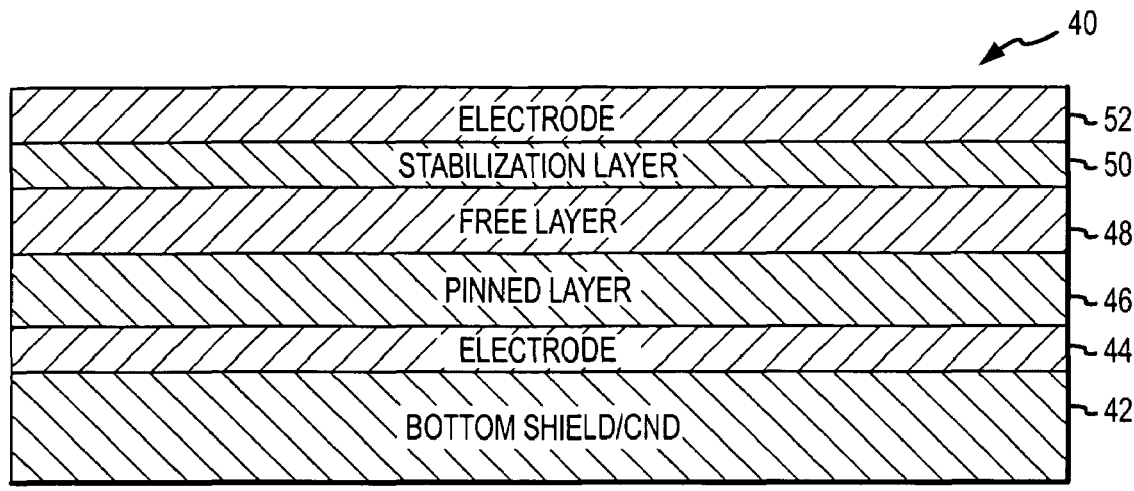
FIG. 3 is a stack of layers of a read head in a preliminary step of producing the read head of the present invention.

FIG. 3 illustrates a preliminary phase in the process of producing a read/write head on the slider 32. As can be seen, the read/write head is a multi-layer element manufactured by depositing a series of thin film layers on top of each other. As illustrated and described herein, certain layers, such as most seed layers, conductors, pinning layers, isolation layers, and so forth, are omitted for ease of illustration and understanding. Instead, the most relevant layers are described herein. A stack 40 of layers is shown, with the bottom layer being a bottom shield 42 that may be composed of NiFe, or any other suitable material. On top of the bottom shield 42, an electrode 44 that may be composed of Ta, Cu, Cr, or any other suitable material, has been deposited. On top of the electrode 44, a pinned layer 46 that may be composed of CoFe or other suitable material has been deposited. On top of the pinned layer 46, a free layer 48 that may be composed of CoFe or other suitable material has been deposited. On top of the free layer 48, a stabilization layer 50 has been deposited that may be composed of IrMn, PtMn, or any other suitable material. On top of the stabilization layer 50, a second electrode 52 has been deposited that may be composed of one of the materials discussed above in conjunction with the electrode 44. As can be appreciated, this is a current-perpendicular-to-plane (CPP) device in which the current flows between the electrodes 44 and 52 through the free layer 48 in a direction that is perpendicular to the plane of the free layer 48. In such a CPP device, there is no need for conductive leads located on either end of the free layer. Of course, if there were conductive leads at either end of the free layer, then this would be a current-in-plane (CIP) device. CPP devices and stabilization techniques therefore are disclosed in U.S. Pat. No. 6,466,419, the contents of which are incorporated by reference herein. While specific materials for the layers in the stack have been described, any other suitable material could also be used.

While not shown, it is possible to adjust the stabilizing field produced by the stabilization layer 50 by putting a layer of Cu or other suitable material between the stabilization layer 50 and the free layer 48. The thickness of the Cu layer will control the strength of the stabilizing field in the free layer 48.

Figure 4:
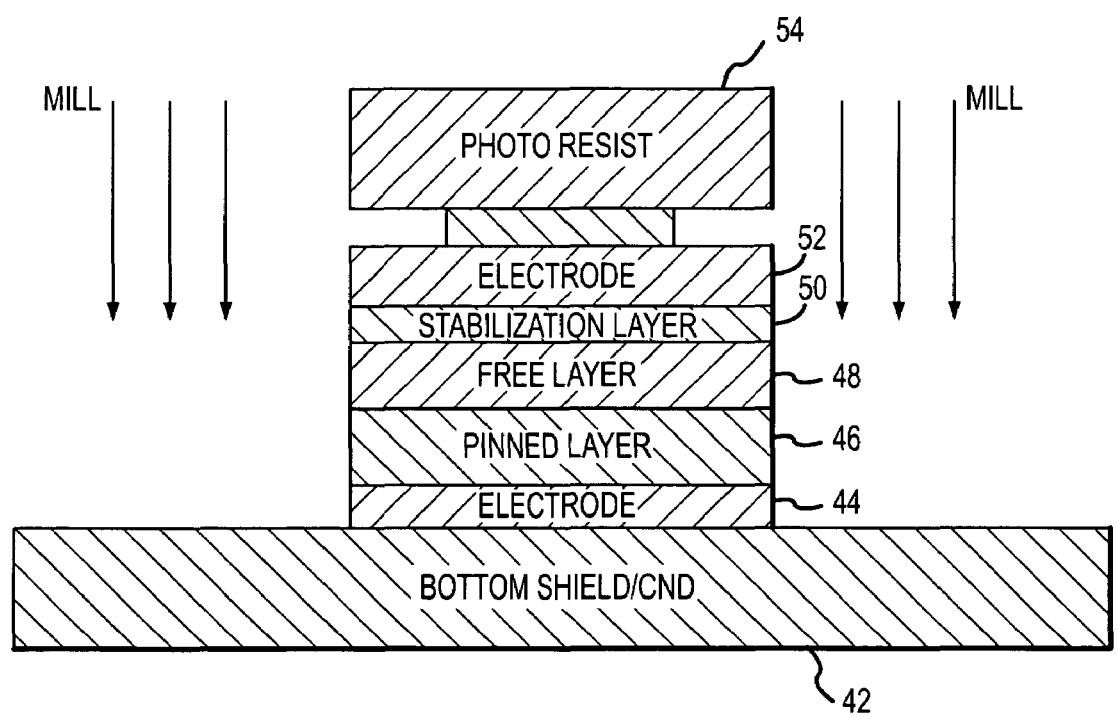
FIG. 4 is a stack of layers of a read head in a subsequent preliminary step of producing the read head of the present invention.

As shown in FIG. 4, an area of photoresist material 54 is deposited on top of the second electrode 52 in a central region thereof. A milling process is then applied to the stack to remove outer regions of each of the layers 44, 46, 48, 50, and 52, other than the bottom shield layer 42. Of course, the regions of those layers underneath the photoresist layer 54 are not removed.

Figure 5:
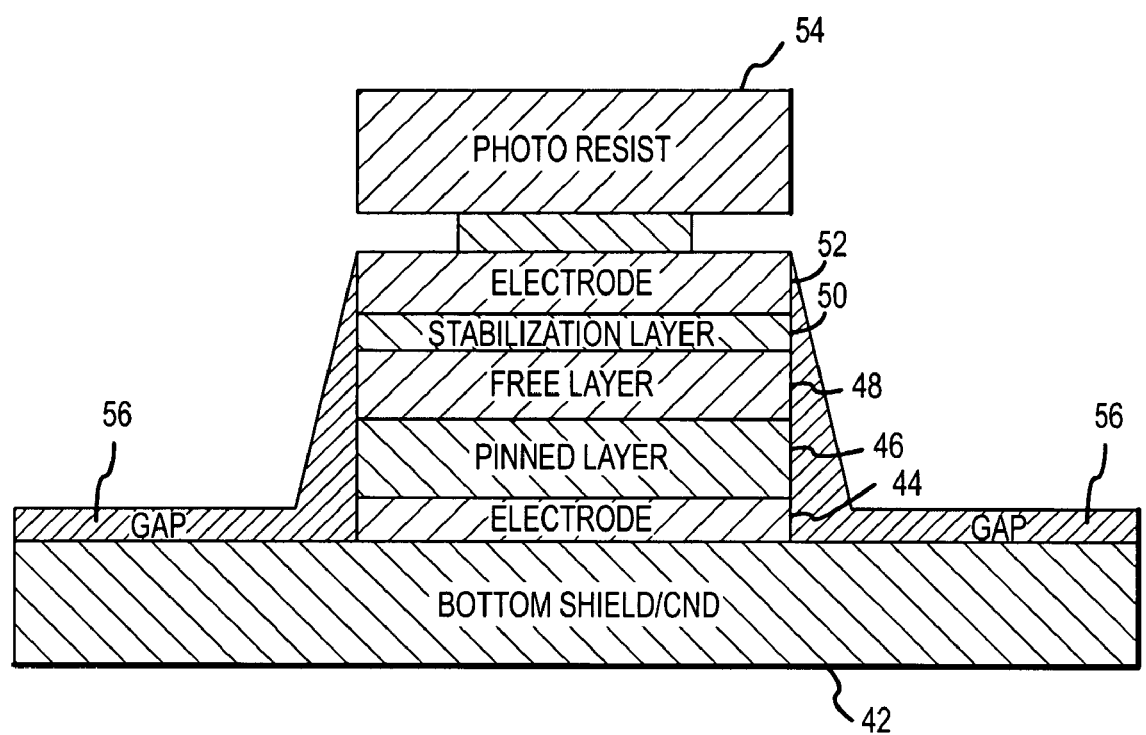
FIG. 5 is a stack of layers of a read head in a subsequent preliminary step of producing the read head of the present invention.

Next, as shown in FIG. 5, an isolation or gap layer 56 that may be composed of aluminum oxide ($Al_2O_3$) or any other suitable gap material is deposited onto the stack by chemical vapor deposition (CVD). As can be appreciated, the gap layer 56 forms primarily on top of the bottom shield layer 42 along with a ramp portion on either side of the remaining layers 44, 46, 48, 50, and 52. The deposition of the gap material in this manner is known as a self-aligned process since no specialized alignment process is required due to the presence of the photoresist material.

Figure 6:
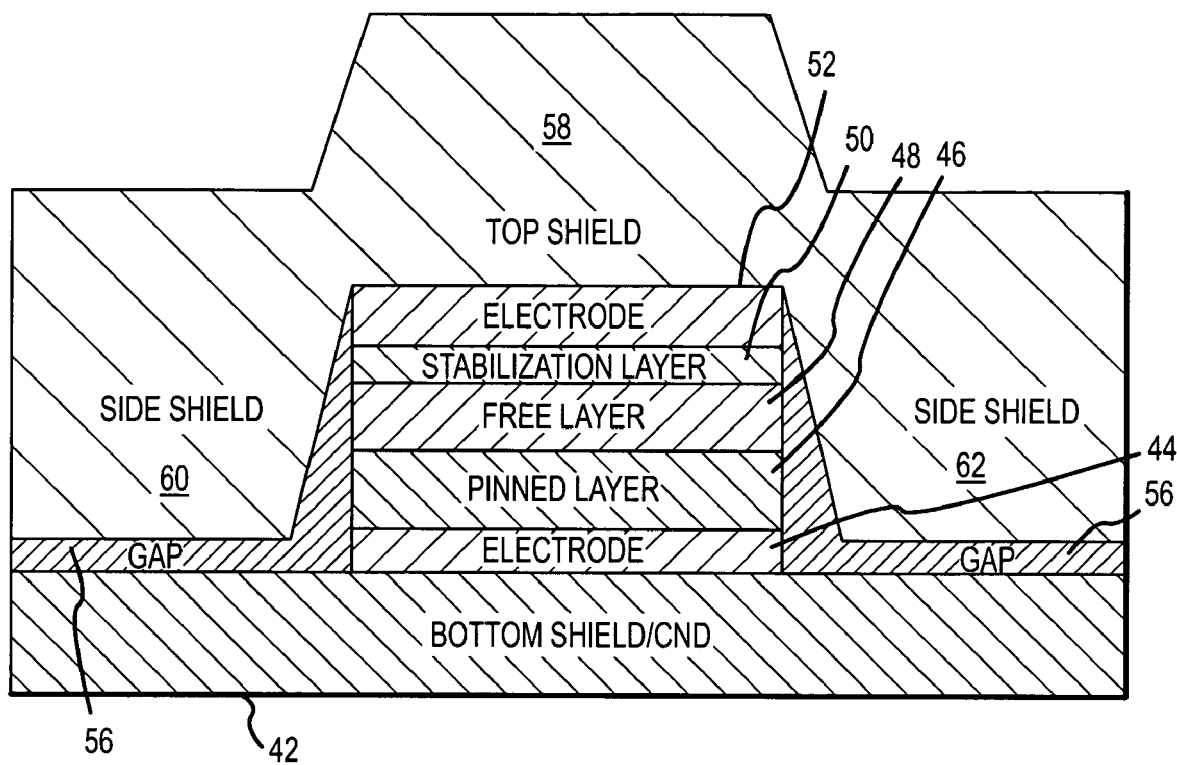
FIG. 6 is a stack of layers of a read head of the present invention, showing a CPP embodiment with pile biasing.

Next, the photoresist layer 54 is lifted off of the stack in a conventional manner. Then, as shown in FIG. 6, a top shield layer 58 is deposited on top of the stack. This top shield includes both seed and plating layers. As can be seen, due to the shape of the stack, the top shield layer 58 includes a pair of side shields 60 and 62 that are integral therewith.

It is believed to be advantageous that the top and side shields 58, 60, and 62 are one integral piece of material. Such a design reduces the number of domain walls. It is believed that an excessive number of domain walls can deteriorate shield performance. This may be because when magnetizations hit boundaries they form surface charges which form stray fields. In this case, the shields will not produce stray fields that can be detected by the free layer 48. It may be possible to optimize the depth of the isolation/gap layer 56 and the angle of the step on either side of the layers 44, 46, 48, 50, and 52, but such optimization has not yet been performed. It is also believed to be advantageous that the spacing between the free layer 48 and the side shields 60 and 62 is so small in this design. It appears that the effect of reducing stray magnetic fields in the vicinity of adjacent tracks is enhanced as the spacing between the free layer and the side shields is decreased.

Of course, in this CPP embodiment, the top and bottom shields 58 and 42 act as conductors to carry sense current toward and away from the electrodes 52 and 44. Because current is designed to flow between the top electrode 52 and the top shield 58, it does not appear to be a problem for there to be little or no gap layer 56 alongside the ends of the electrode 52.

Figure 7:
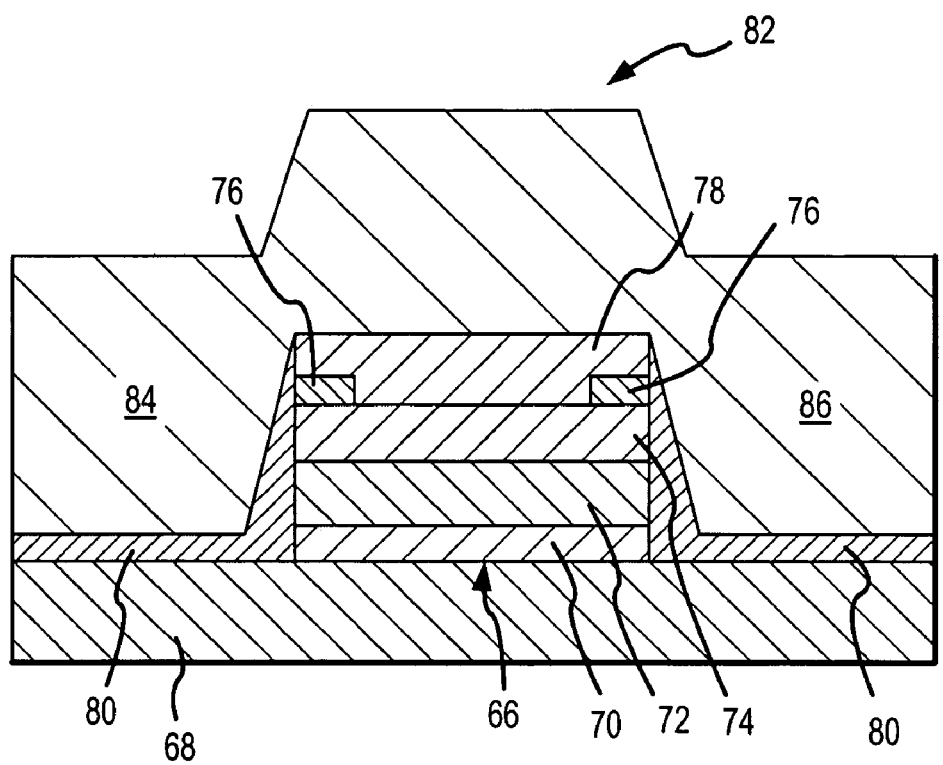
FIG. 7 is a stack of layers of a read head of the present invention, showing a CPP embodiment with patterned exchange biasing.

Alternatively, instead of the pile biasing scheme shown in FIGS. 3-6, the present invention could be implemented in a device that uses patterned exchange biasing (PEB) in a CPP embodiment. As shown in FIG. 7, using fabrication techniques similar to those described in FIGS. 3-6, a stack 66 of layers has been deposited on top of a bottom shield 68. The stack includes an electrode 70, a pinned layer 72, a free layer 74, and a pair of regions of exchange material 76, such as an antiferromagnetic material like platinum manganese (PtMn), that has been deposited above opposite ends of the free layer 74. On top of and between the portions of exchange material 76, an electrode 78 has been deposited. A gap layer 80 has been deposited on top of the bottom shield and alongside of the stack 66. On top of all of this, a top shield 82 that includes side shields 84 and 86 has been deposited.

Figure 8:
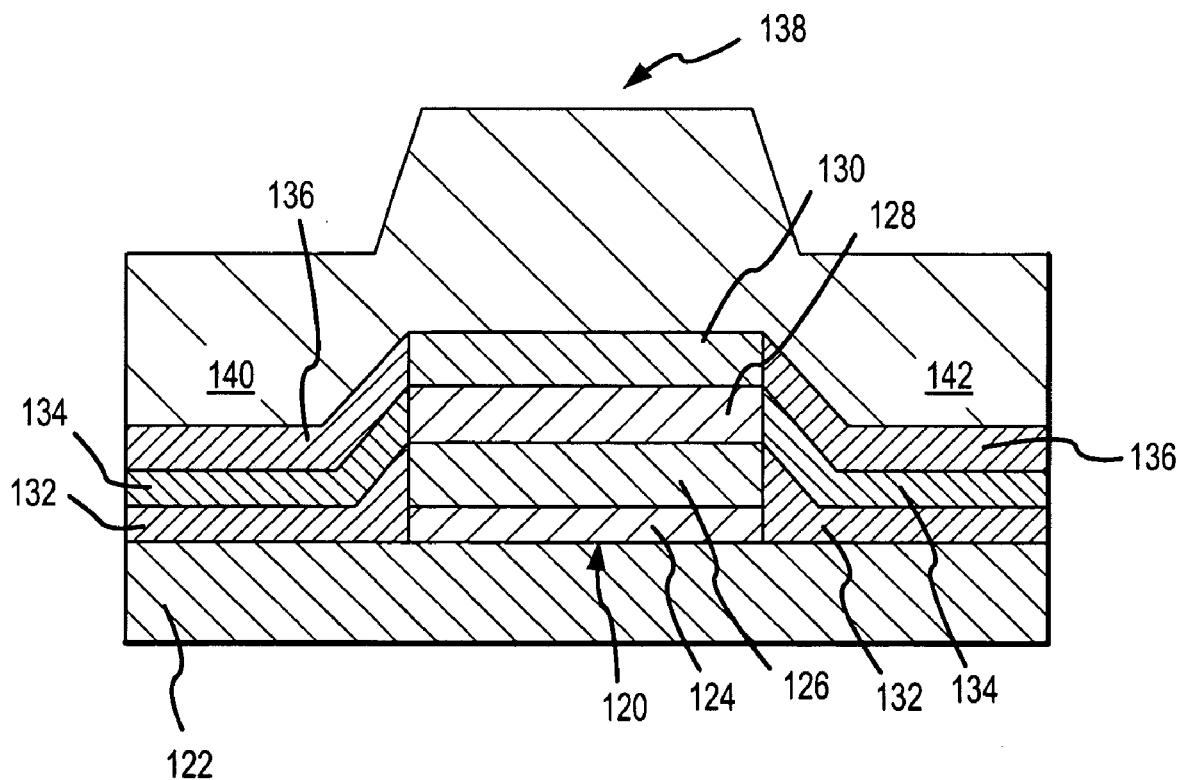
FIG. 8 is a stack of layers of a read head of the present invention, showing a CPP embodiment with permanent magnet abutted junctions.

As another alternative, the present invention could be implemented in a CPP embodiment having permanent magnet abutted junctions, as shown in FIG. 8. A stack 120 of layers has been deposited on top of a bottom shield 122. The stack 120 includes an electrode 124, a pinned layer 126, a free layer 128, and a second electrode 130. In a fabrication process similar to that described above in regard to FIGS. 3-6, a gap layer 132 is deposited onto the portions of the bottom shield 122 adjacent to the stack 120. In this case, however, the gap layer 132 covers only the sides of the electrode 124 and pinned layer 126, leaving the free layer 128 exposed on its sides. On top of this gap layer 132, a permanent magnet layer 134 is deposited so that it abuts the sides of the free layer 128, with another gap layer 136 deposited thereon. On top of all of this, a top shield 138 having side shields 140 and 142 is deposited.

Figure 9:
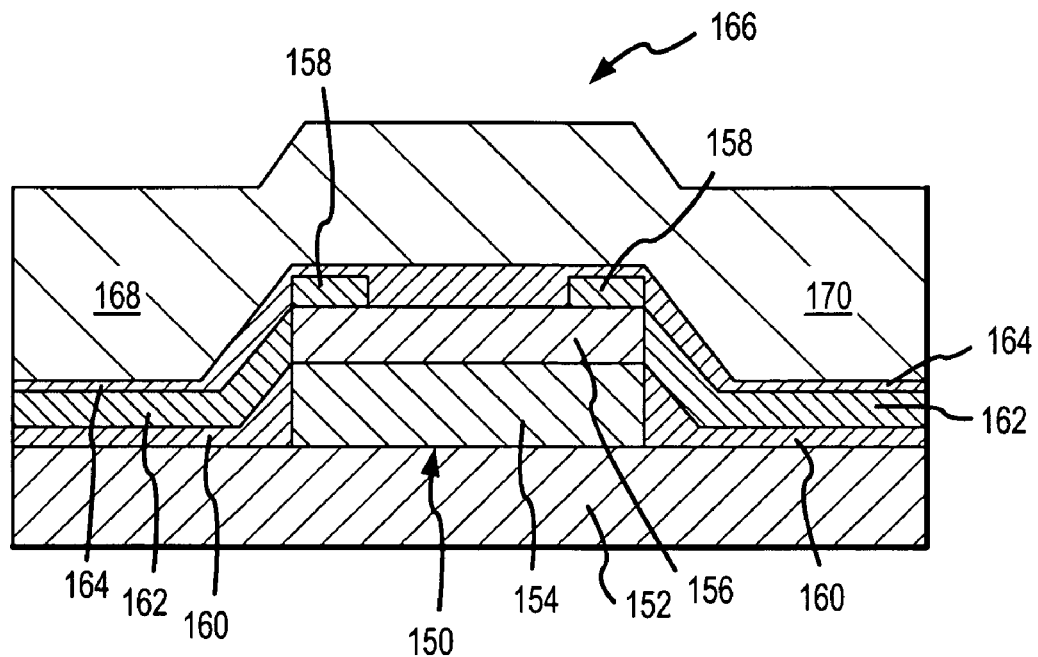
FIG. 9 is a stack of layers of a read head of the present invention, showing a CIP embodiment with patterned exchange biasing.

Alternatively, it is also possible to implement the present invention in a CIP embodiment, as shown in FIG. 9. This embodiment includes a PEB biasing arrangement. A stack 150 has been deposited onto a bottom shield 152. The stack 150 includes a pinned layer 154 and a free layer 156. Also, two regions of exchange material 158 have been placed above opposite ends of the free layer 156. In a manner similar to that described above in conjunction with FIGS. 3-6, a first gap layer 160 has been deposited onto the bottom shield 152. On top of this first gap layer 160, a conductor layer 162 has been deposited. On top of all of this, a second gap layer 164 has been deposited. On top of all of that, a top shield 166 having side shields 168 and 170 has been deposited. As can be appreciated, the conductor layer 162 is aligned with opposite ends of the free layer 156, to carry a sense current toward and away from the free layer.

Figure 10:
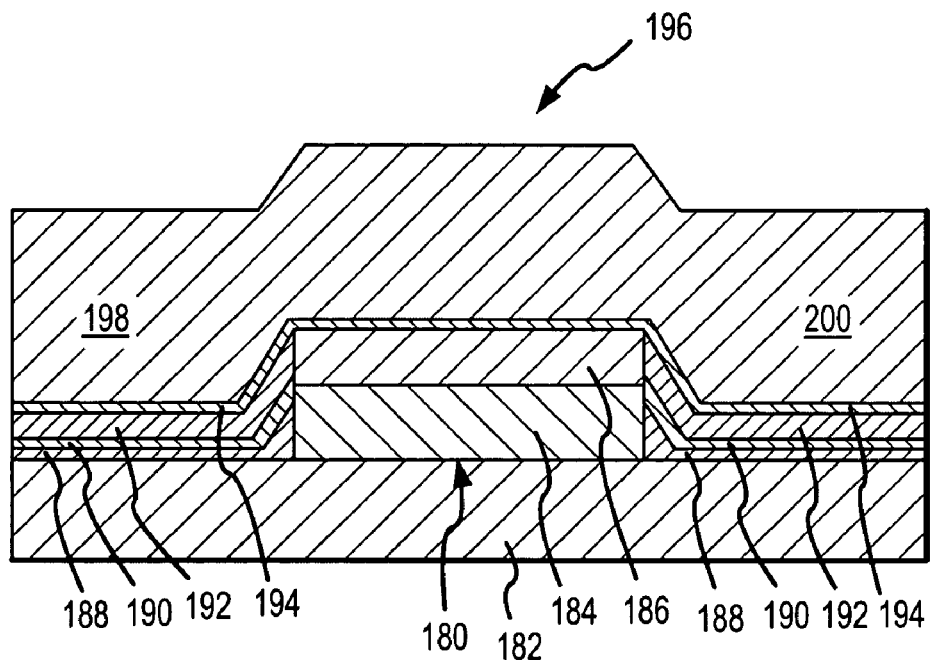
FIG. 10 is a stack of layers of a read head of the present invention, showing a CIP embodiment with permanent magnet abutted junctions.

Alternatively, the present invention can be implemented in a CIP design having permanent magnet abutted junctions, as shown in FIG. 10. A stack 180 of layers has been deposited on top of a bottom shield 182. The stack 180 includes a pinned layer 184 and a free layer 186. In a manner similar to the fabrication process described above in conjunction with FIGS. 3-6, a first gap layer 188 is deposited on top of the bottom shield 182 on either side of the stack 180. On top of this gap layer 188, a conductor layer 190 is then deposited. The conductor layer 190 has a significant portion in contact with opposite ends of the free layer 186. On top of the conductor layer 190, a permanent magnet layer 192 is deposited with the permanent magnet layer 192 being abutted against opposite ends of the free layer 186. On top of the permanent magnet layer 192 and the free layer 186, a second gap layer 194 is deposited. On top of this gap layer 194, a top shield 196 including side shields 198 and 200 is deposited.

As can be appreciated each of the described embodiments of the present invention provide side shields which help to minimize magnetic fields in the vicinity of adjacent tracks, thus reducing adjacent track reads. Modeling has revealed that by adding side shields as are described herein, side-reading or adjacent-track-sensitivity can be reduced by 57%. Further, a easily-manufacturable process for producing read heads with side shields has been disclosed.

The foregoing description of the present invention has been presented for purposes of illustration and description. It should be appreciated that the illustrations are not drawn to scale and that the shields are many times thicker than the other layers, for example. Furthermore, the description is not intended to limit the invention to the form disclosed herein. For example, the side shields could be integral portions of the bottom shield instead of the top shield. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

The invention claimed is:

1. A read head, comprising:
    a GMR spin valve stack including at least a pinned layer, a free layer, wherein sides of the pinned layer and the free layer are substantially aligned, and a stabilization layer including a pair of separated regions of patterned exchange bias material, each region of patterned exchange bias material being disposed over a respective one of opposite ends of the free layer; and
    a pair of shields, one disposed on either side of the GMR spin valve stack, with one of the shields being formed to include integral side shields that substantially enclose the free layer between the pair of shields;
    wherein the separated regions of patterned exchange bias material are located between the free layer and an electrode between the free layer and a shield.

2. A read head as defined in claim 1, wherein the GMR spin valve stack is configured to operate in a current perpendicular to plane (CPP) mode.

3. A read head as defined in claim 1, wherein the GMR spin valve stack is configured to operate in a current in plane (CIP) mode.

4. A read head as defined in claim 3, further including electrically conductive leads that are in a gap formed between the pair of shields.

5. A read head as defined in claim 1, further including a layer of insulating material forming a gap between the pair of shields in the regions at either end of the GMR spin valve stack.

6. A read head as defined in claim 5, wherein the gap layer is deposited in a self-aligned process.

7. A read head as defined in claim 5, wherein the gap layer includes a portion that covers at least portions of the sides of the stack.

8. The read head of claim 1, wherein the electrode is formed over an upper surfaces of the separated regions of patterned exchange bias material and between the separated regions of patterned exchange bias material.

9. The read head of claim 1, wherein a gap layer is located between sides of the separated regions of patterned exchange bias material and the pair of shields.

10. The read head of claim 1, wherein sides of the separated regions of patterned exchange bias material are substantially aligned with the sides of the free layer and the pinned layer of the GMR spin valve stack.

11. A read head, comprising:
    a GMR spin valve stack including at least a pinned layer, a free layer, wherein sides of the pinned layer and the free layer are substantially aligned, and a stabilization layer including a pair of separated regions of patterned exchange bias material, each region of patterned exchange bias material being disposed over a respective one of opposite ends of the free layer; and
    a pair of shields, one disposed on either side of the GMR spin valve stack, with one of the shields being formed to include integral side shields that substantially enclose the free layer between the pair of shields
    wherein the GMR spin valve stack is configured to operate in a current perpendicular to plane (CPP) mode; and
    wherein the pair of shields are electrically conductive and wherein the GMR spin valve stack includes an electrode at the top thereof and an electrode at the bottom thereof.

12. A read head as recited in claim 11, wherein at least a portion of the electrode at the top of the GMR spin valve stack is located between the pair of regions of patterned exchange material.

13. A read head, comprising:
a GMR spin valve stack including at least a pinned layer and a free layer;
a first shield disposed at a first end of the GMR spin valve stack and a second shield disposed at a second end of the GMR spin valve stack, the second shield being formed to include integral side shields that extend toward the first shield; and
an insulated layer of permanent magnet material disposed between the shields and abutting the free layer,
wherein the integral side shields of the second shield extend beyond at least a portion of the insulated layer of permanent magnet material.

14. A read head as defined in claim 13, wherein the GMR spin valve stack is configured to operate in a current perpendicular to plane (CPP) mode.

15. A read head as defined in claim 14, wherein the pair of shields are electrically conductive and wherein the GMR spin valve stack includes an electrode at the top thereof and an electrode at the bottom thereof.

16. A read head as defined in claim 13, further including a pair of gap layers of insulating material, one disposed on either side of the permanent magnet material to form a gap between the first and second shields in the regions at either end of the GMR spin valve stack.

17. A read head as defined in claim 16, wherein the gap layer is deposited in a self-aligned process.

18. A read head as defined in claim 16, wherein the gap layer includes a portion that covers at least portions of the sides of the stack.

19. A read head as defined in claim 13, wherein the free layer has opposed ends and the layer of permanent magnet material abuts at least a portion of the ends of the free layer.

20. The read head of claim 13, wherein the insulated layer of permanent magnet material comprises:
a first insulating layer abutting a lower portion of the GMR spin valve stack;
a permanent magnet material layer abutting the free layer of the GMR spin valve stack; and
a second insulating layer formed over the permanent magnet material layer.

21. The read head of claim 20, wherein the first insulating layer abuts the pinned layer of the GMR spin valve stack and the pinned layer is on top of an electrode.

22. The read head of claim 20, wherein the permanent magnet material layer has a thickness that is substantially equal to a thickness of the free layer of the GMR spin valve stack.

23. The read head of claim 13, wherein the insulated layer of permanent magnet material comprises:
a first insulating layer abutting a lower portion of the GMR spin valve stack; and
a permanent magnet material layer abutting the free layer of the GMR spin valve stack; and
wherein the integral sides shields of the second shield extend beyond at least a portion of the permanent magnet material layer abutting the free layer.

24. The read head of claim 23, wherein the insulated layer of permanent magnet material further comprises a second insulating layer formed over the permanent magnet material layer; and
wherein the integral sides shields of the second shield extend beyond at least a portion of the second insulating layer.

25. A read head, comprising:
a GMR spin valve stack including at least a pinned layer and a free layer;
a first shield disposed at a first end of the GMR spin valve stack and a second shield disposed at a second end of the GMR spin valve stack, the second shield being formed to include integral side shields that extend toward the first shield; and
an insulated layer of permanent magnet material disposed between the shields and abutting the free layer,
wherein the integral side shields of the second shield extend beyond at least a portion of the insulated layer of permanent magnet material
wherein the GMR spin valve stack is configured to operate in a current in plane (CIP) mode.

26. A read head as defined in claim 25, further including electrically conductive leads that are with the permanent magnet material in a gap formed between the first and second shields.

27. A read head as defined in claim 26, further including a layer of insulating material on either side of the permanent magnet material and conductive leads at either end of the GMR spin valve stack.

28. A read head, comprising:
a GMR spin valve stack including at least a pinned layer and a free layer;
a first shield disposed at a first end of the GMR spin valve stack and a second shield disposed at a second end of the GMR spin valve stack, the second shield being formed to include integral side shields that substantially enclose at least a portion of the free layer; and
an insulated layer of permanent magnet material disposed between the shields and abutting opposite ends of the GMR spin valve stack, the insulated layer of permanent magnetic material comprising a first insulating layer abutting a lower portion of the GMR spin valve stack including said pinned layer on top of an electrode.

29. The read head of claim 28, wherein the insulated layer of permanent magnet material comprises:
said first insulating layer abutting a lower portion of the GMR spin valve stack;
a permanent magnet material layer abutting the free layer of the GMR spin valve stack; and
a second insulating layer formed over the permanent magnet material layer.

30. The read head of claim 29, wherein the permanent magnet material layer has a thickness that is substantially equal to a thickness of the free layer of the GMR spin valve stack.

31. The read head of claim 28, wherein the insulated layer of permanent magnet material comprises:
said first insulating layer abutting a lower portion of the GMR spin valve stack; and
a permanent magnet material layer abutting the free layer of the GMR spin valve stack; and
wherein the integral sides shields of the second shield extend beyond at least a portion of the permanent magnet material layer abutting the free layer.

32. The read head of claim 31, wherein the insulated layer of permanent magnet material further comprises a second insulating layer formed over the permanent magnet material layer; and
wherein the integral sides shields of the second shield extend beyond at least a portion of the second insulating layer.

33. A read head, comprising:
a GMR spin valve stack including at least a pinned layer, a free layer, wherein sides of the pinned layer and the free layer are substantially aligned, and a stabilization layer including a pair of separated regions of patterned exchange bias material, each region of patterned exchange bias material being disposed over a respective one of opposite ends of the free layer; and
a pair of shields, one disposed on either side of the GMR spin valve stack, with one of the shields being formed to include integral side shields that substantially enclose the free layer between the pair of shields;
wherein sides of the separated regions of patterned exchange bias material are substantially aligned with the sides of the free layer and the pinned layer of the GMR spin valve stack;
wherein the separated regions of patterned exchange bias material are located between the free layer and an electrode, and
wherein sides of the electrode are substantially aligned with sides of the separated regions of patterned exchange bias material.

* * * * *